United States Patent
Nairn

(10) Patent No.: US 7,183,812 B2
(45) Date of Patent: Feb. 27, 2007

(54) STABLE SYSTEMS FOR COMPARING AND CONVERTING SIGNALS

(75) Inventor: David Graham Nairn, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 141 days.

(21) Appl. No.: 11/088,364

(22) Filed: Mar. 23, 2005

(65) Prior Publication Data

US 2006/0214700 A1    Sep. 28, 2006

(51) Int. Cl.
H03K 5/22    (2006.01)

(52) U.S. Cl. .............................. 327/63; 327/65; 327/66; 327/52; 327/55

(58) Field of Classification Search ...................... None
See application file for complete search history.

(56) References Cited

U.S. PATENT DOCUMENTS

| | | | | |
|---|---|---|---|---|
| 5,245,223 | A * | 9/1993 | Lim et al. ...................... | 327/80 |
| 5,345,121 | A * | 9/1994 | Itoh ............................... | 327/55 |
| 5,963,060 | A * | 10/1999 | Varadarajan et al. ........... | 327/55 |
| 6,215,331 | B1 * | 4/2001 | Setty et al. ..................... | 327/51 |
| 6,249,240 | B1 | 6/2001 | Bellaouar .................... | 341/172 |
| 6,396,429 | B2 * | 5/2002 | Singer et al. ............... | 341/155 |
| 6,556,060 | B1 * | 4/2003 | Dillon et al. ................. | 327/210 |
| 6,608,503 | B2 | 8/2003 | Shenai et al. .................. | 327/77 |
| 6,611,163 | B1 | 8/2003 | Mukherjee et al. .......... | 327/337 |
| 6,617,887 | B2 | 9/2003 | Nix .............................. | 327/65 |
| 6,703,871 | B2 * | 3/2004 | You et al. ..................... | 327/52 |
| 6,831,586 | B2 | 12/2004 | Jansson ....................... | 341/158 |
| 6,847,234 | B2 | 1/2005 | Choi ........................... | 327/65 |

OTHER PUBLICATIONS

Kim, K. Y., et al., "A 10-bit, 100 MS/s CMOS A/D Converter", IEEE Journal of Solid State Circuits, Apr. 1997.
McCarroll, Benjamin, et al., "A High-Speed CMOS Comparator for Use in an ADC", IEEE Journal of Solid-State Circuits, vol. 23, No. 1, Feb. 1988, pp. 159-165.
Wu, Hieh-tsorng, et al., "A 100-MHz Pipelined CMOS Comparator", IEEE Journal of Solid-State Circuits, vol. 23, No. 6, Dec. 1988, pp. 1379-1385.
Sackinger, Eduard, et al., "A Versatile Building Block: The CMOS Differential Difference Amplifier", IEEE Journal of Solid-State Circuits, vol. SC22, No. 2, Apr. 1987, pp. 287-294.

* cited by examiner

Primary Examiner—Timothy P. Callahan
Assistant Examiner—An T. Luu
(74) Attorney, Agent, or Firm—Koppel, Patrick, Heybl & Dawson

(57) ABSTRACT

Comparator systems are provided that include cross-coupled transistors which respond to a differential network that receives an input signal. The systems further include a control transistor connected across the cross-coupled transistors and a bias network configured to apply a bias voltage to the control transistor that is substantially the voltage across two transistors which are each biased into saturation. It has been found that this bias during the systems' acquire phase substantially stabilizes the systems' gain over variations in their total environment and that this stabilization enhances the systems' performance.

20 Claims, 6 Drawing Sheets

STABLE SYSTEMS FOR COMPARING AND CONVERTING SIGNALS

BACKGROUND OF THE INVENTION

1. Field of the Invention

The present invention relates generally to signal comparators.

2. Description of the Related Art

Signal comparators generally compare the magnitude of an input signal to a reference signal (which may simply be a ground level) and produce an output that indicates the input signal's relationship to the reference signal. This function is an important part of signal conditioning systems. In most analog-to-digital converters, for example, comparison is necessary to initiate the process of quantizing an unknown analog signal.

Modern signal conditioning systems demand a high degree of processing accuracy but it has often been found that the comparators of these systems do not always maintain this accuracy over variations in the systems' total environment (e.g., variations in fabrication process, in operational temperature and in operational supply voltage).

BRIEF SUMMARY OF THE INVENTION

The present invention is directed to comparator systems that have enhanced system performance. The novel features of the invention are set forth with particularity in the appended claims. The invention will be best understood from the following description when read in conjunction with the accompanying drawings.

DETAILED DESCRIPTION OF THE INVENTION

FIGS. 1–7 illustrate comparator systems that include cross-coupled transistors which respond to a differential network that receives an input signal. The systems further include a control transistor connected across the cross-coupled transistors and a bias network configured to apply to the control transistor:

a) in a system latch phase, a bias voltage that biases off the control transistor; and b) in a system acquire phase, a bias voltage that substantially stabilizes the comparator system's gain over variations in the system's environment.

Figure 1:
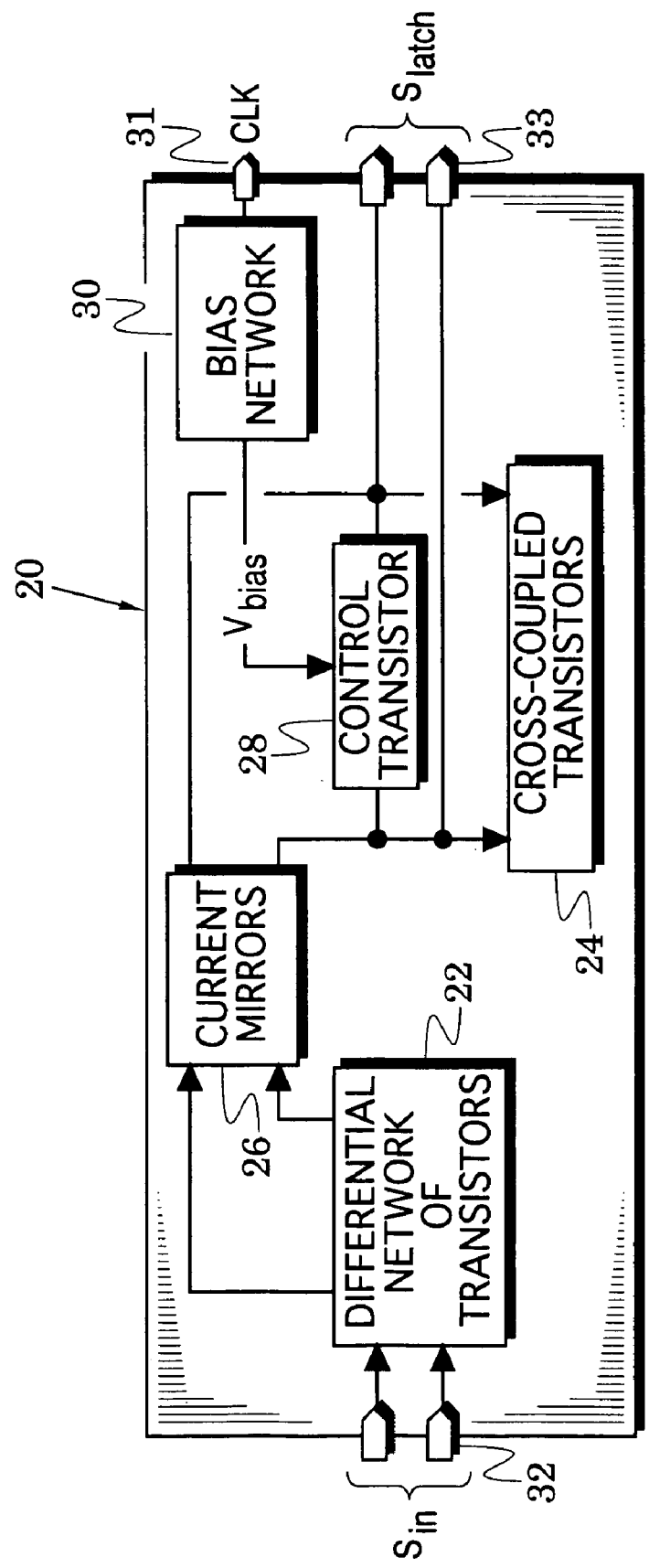
FIG. 1 is a diagram of a comparator system embodiment of the present invention.

In particular, FIG. 1 illustrates a comparator system 20 that includes a differential network of transistors 22, cross-coupled transistors 24, and current mirrors 26 that couple output signals of the differential network 22 to the cross-coupled transistors 24. A control transistor 28 is coupled across the cross-coupled transistors 24 and this control transistor responds to a bias network 30 that provides a bias voltage $V_{bias}$ in response to a clock signal (CLK) at a clock port 31.

In operation of the comparator system 20, the differential network of transistors 22 compares an input signal $S_{in}$ at an input port 32 to a reference signal (not shown) and sends a corresponding output signal via the current mirrors 26 to the cross-coupled transistors 24. During an acquire phase of the comparator system 20, the control transistor 28 substantially nulls a latch signal $S_{latch}$ across the cross-coupled transistors.

In response to each pulse of the clock signal that corresponds to a latch phase of the system 20, the bias network 30 alters the bias voltage $V_{bias}$ so that the control transistor 28 is turned off. This allows the feedback of the cross-coupled transistors to rapidly switch them to a state that corresponds to the relationship between the input signal $S_{in}$ and the reference signal at the time the clock pulse was initiated. At an output port 33, this latch phase of operation provides a latch signal $S_{latch}$ which indicates the state of the cross-coupled transistors.

It has been determined that a high system gain (i.e., gain from the input port 32 to the latch port 33) during the system's acquire phase will enhance the system's performance parameters (e.g., faster reaction time and reduced internal offsets). However, it has also been found that variations in the system's total environment (e.g., variations in fabrication process, in operational temperature and in operational supply voltage) cause the system gain to vary widely and that these variations significantly degrade the system gain.

The system embodiments of the invention act to substantially stabilize the system gain over variations in the system's environment. Because a description of these embodiments will enhance a subsequent investigation of how they stabilize system gain, this description is initially addressed with reference to FIGS. 2 and 3.

Figure 2:
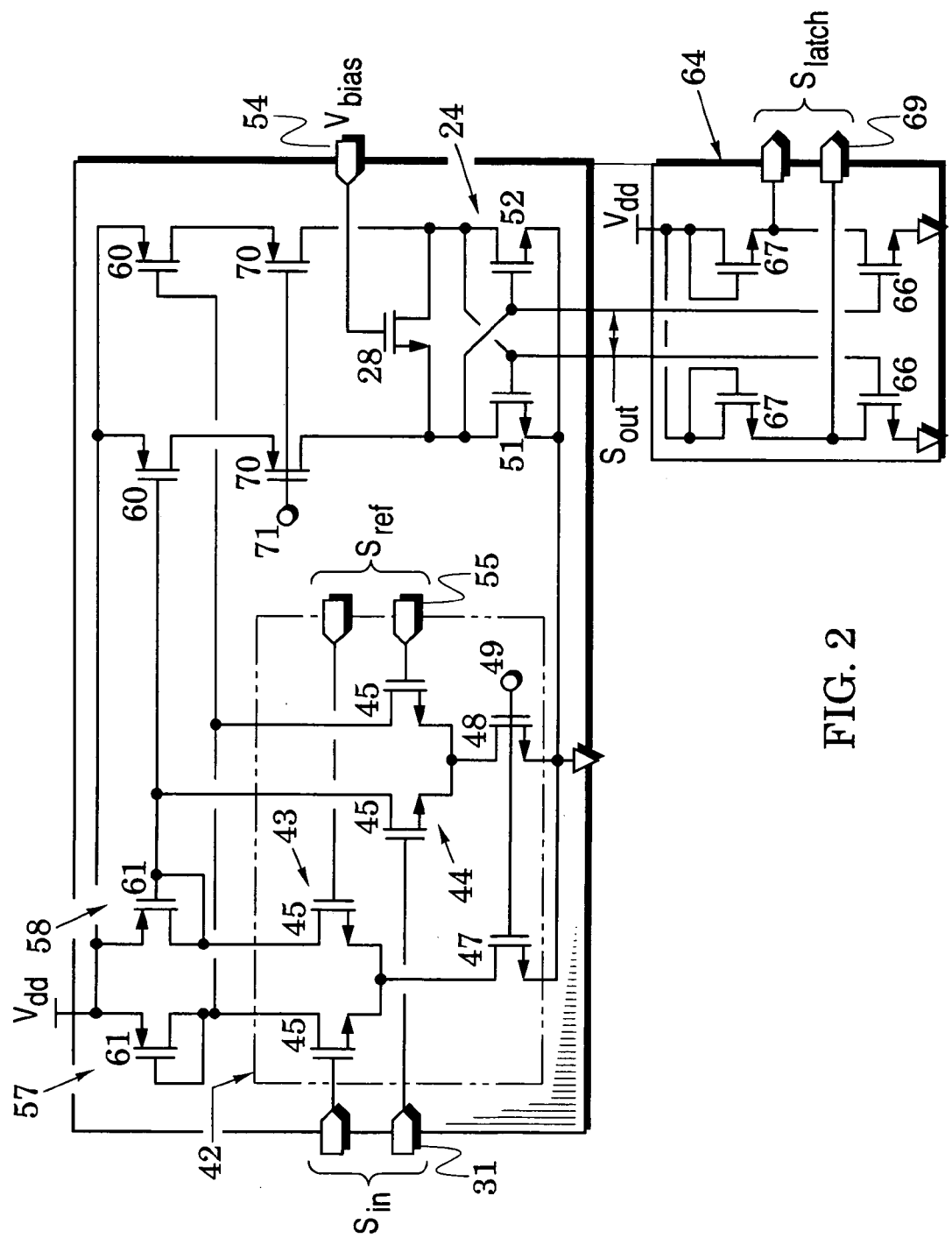
FIG. 2 is a schematic of an embodiment of portions of the system of FIG. 1.
Figure 3:
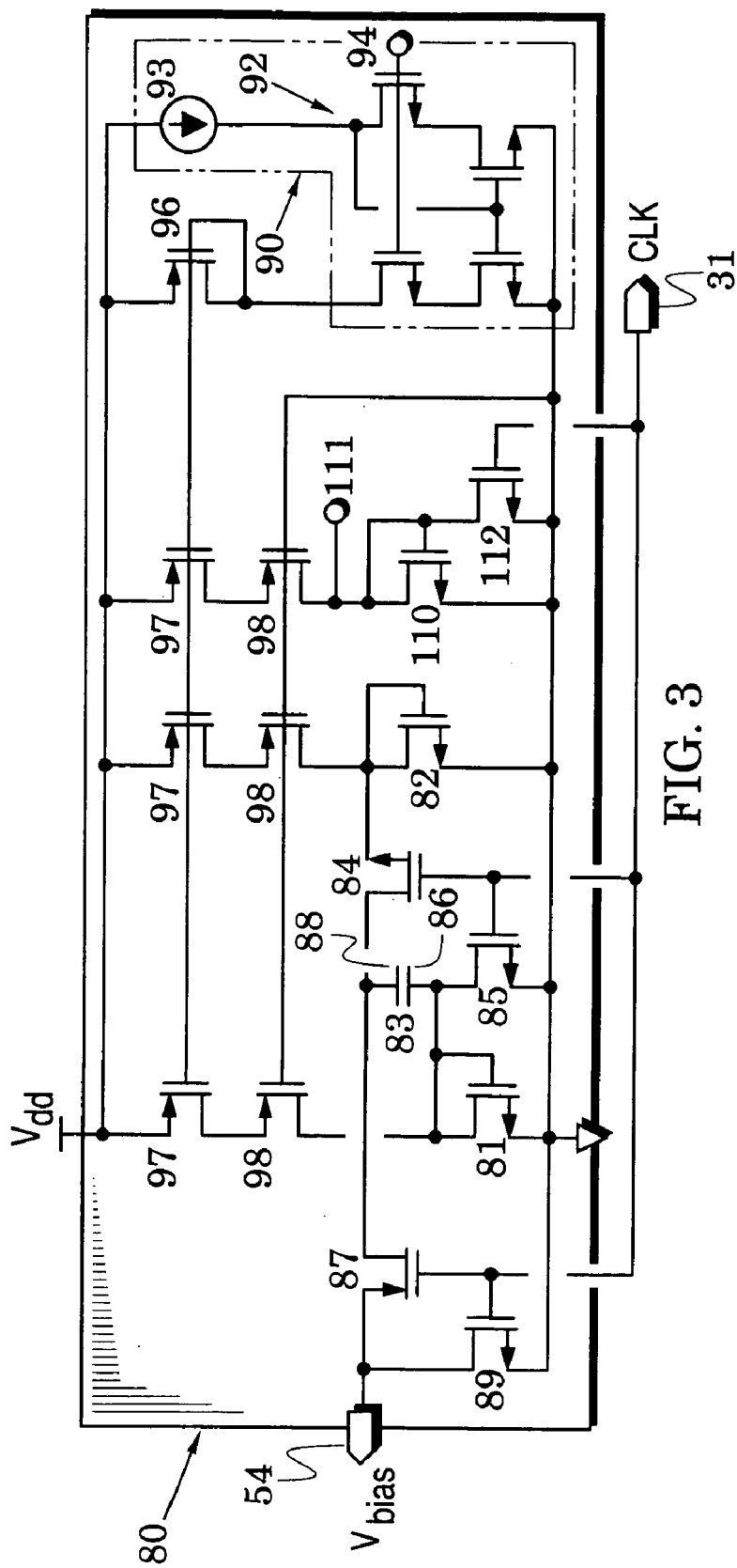
FIG. 3 is a schematic of an embodiment of the bias network of the system of FIG. 2.

FIG. 3 illustrates an embodiment of the bias network 30 of FIG. 1 and FIG. 2 illustrates an embodiment of the other elements of the comparator system of FIG. 1. In particular, FIG. 2 shows that an embodiment of the differential network of transistors 22 is a differential difference amplifier 42 which is formed with first and second differential pairs 43 and 44 of transistors 45. First and second current sources 47 and 48 provide tail currents respectively to the first and second differential pairs 43 and 44 in response to a potential at a bias terminal 49.

The cross-coupled transistors 24 of FIG. 1 are realized with transistors 51 and 52 in FIG. 2 and the control transistor 28 is shown with its control terminal (e.g., gate) receiving the bias voltage $V_{bias}$ from a bias port 54.

The differential input signal $S_{in}$ at the input port 31 is applied to one side of each of the first and second differential pairs and a reference signal $S_{ref}$ is applied (through a reference port 55) to the other side of each of these pairs. In response to the input signal $S_{in}$ and the reference signal $S_{ref}$, each of the differential pairs 43 and 44 steer the current of their respective current source to thereby provide current output signals which are mirrored to the cross-coupled transistors 24. In particular, the output currents are cross coupled to first and second current mirrors 57 and 58 that each comprise a transistor 60 which has its control terminal (e.g., gate) coupled to the control terminal of a diode-coupled transistor 61.

Although a latch signal $S_{latch}$ can be taken directly from the cross-coupled transistors 24, inverters 66 are preferably inserted to deliver the latch signal $S_{latch}$. The inverters each have an active load in the form of a diode-coupled transistor 67. The inverters respond to the cross-coupled pair 24 and deliver the latch signal $S_{latch}$ at a latch port 69 that is coupled across the active loads. Accordingly, the latch signal $S_{latch}$ is inverted from its the state at the cross-coupled transistors 24.

Because the current mirror transistors 60 are generally large devices (i.e., having large gate dimensions), they may present significant capacitances which would slow the reaction time of the comparator system. Preferably, therefore, this capacitance is shielded from the cross-coupled transistors 24 by insertion of transistors 70 that are arranged to form cascode stages with their respective current transistors 60. The transistors 70 receive an appropriate bias at a bias port 71.

FIG. 3 illustrates a bias network embodiment 80 that provides the bias voltage $V_{bias}$ at a bias port 54 (same port as shown in FIG. 2). This embodiment includes first and second diode-coupled transistors 81 and 82 and a capacitor 83 that is inserted between these transistors. The capacitor is directly connected to the first diode-coupled transistor 81 but is coupled to the second diode-coupled transistor 82 by a first switch transistor 84 with a second switch transistor 85 arranged to couple a lower plate 86 of the capacitor to ground. A third switch transistor 87 couples an upper plate 88 of the capacitor 83 to the bias port 54 and a fourth switch transistor 89 couples the bias port to ground. The first, second, third and fourth switch transistors 84, 85, 87 and 89 respond to the clock signal that is present at the clock port 31 (also shown in FIG. 1).

A current source 90 is formed with a "low-voltage cascode" current mirror 92 that is biased by a current source 93 and a potential at a mirror terminal 94. The current of the current source 90 is mirrored to a diode-coupled transistor 96 which, in turn, mirrors current to current transistors 97. Transistors 98 are inserted between two of the current transistors 97 and the first and second diode-coupled transistors 81 and 82. Control terminals (e.g., gates) of the transistors 98 are biased by coupling them to ground.

It is noted that the transistors 98 form cascode stages with their respective current transistors 97 and each of these cascode stages is coupled to a respective one of the first and second diode-coupled transistors 81 and 82. As described above with reference to FIG. 2, cascode stages were formed by transistors 60 and 70 and each of these stages was coupled to a respective one of the cross-coupled transistors 51 and 52. Thus, the first and second diode-coupled transistors 81 and 82 of FIG. 3 share the same circuit environment with the cross-coupled transistors 51 and 52 of FIG. 2. For example, they "see" the same variations in fabrication process, operational temperature and operational supply voltage so that parameter variations of the first and second diode-coupled transistors 81 and 82 track parameter variations of the cross-coupled transistors 51 and 52.

Operation of the bias network 80 of FIG. 3 may be examined with reference to operational acquire and latch phases which are successively commanded by the clock signal at the clock port 31. In each latch phase, the clock signal turns on switch transistors 84, 85 and 89 and turns off switch transistor 87. Thus, the bias port 54 is shorted through switch transistor 89 to ground and isolated from the remainder of the bias network by switch transistor 87. At the same time, the lower plate 86 of the capacitor 83 is shorted through switch transistor 85 to ground and the upper plate 88 is charged through switch transistor 84 to the voltage across the diode-coupled transistor 82.

In each acquire phase, the clock signal turns off switch transistors 84, 85 and 89 and turns on switch transistor 87. Switch transistor 89 is now a high impedance and the bias port 54 is coupled through switch transistor 87 to the upper plate 88 of the capacitor 83. Switch transistors 84 and 85 are now high impedances so that the lower plate 86 of the capacitor 83 assumes the voltage across the diode-coupled transistor 81. Because the capacitor 83 was previously charged to the voltage across the diode-coupled transistor 82, the upper plate 88 causes the bias voltage $V_{bias}$ at the bias port 54 to take on a voltage substantially the same as the voltage across two serially-connected diode-coupled transistors (e.g., transistors 81 and 82).

Attention is now directed to the operation of the differential difference amplifier 42, cross-coupled transistors 24 and control transistor 28 of FIG. 2 in these latch and acquire phases. During each latch phase, the bias voltage $V_{bias}$ at the bias port 54 is set to ground (as described above with reference to the operation of the bias network 80 of FIG. 3) so that the control transistor 28 is in a high impedance state and the cross-coupled transistors are allowed to respond to the currents mirrored to them from the differential difference amplifier 42.

If the input signal $S_{in}$ differs from the reference signal $S_{ref}$, there will be a corresponding imbalance in the currents mirrored through the first and second current mirrors 57 and 58 to the cross-coupled transistors 51 and 52. Feedback of the cross-coupled transistors causes them to rapidly switch to a state that corresponds to this imbalance and, hence, to the corresponding relationship between the input signal $S_{in}$ and the reference signal $S_r$ at initiation of the latch phase. This state is indicated by an output signal $S_{out}$ across the cross-coupled transistors (or by the inverted latch signal $S_{latch}$).

During each acquire phase, the bias network 80 of FIG. 3 causes the bias voltage $V_{bias}$ at the bias port 54 to be substantially the same as the voltage across two serially-connected diode-coupled transistors. This voltage is received from the top plate 88 of the capacitor 83 and is generated by the diode-coupled transistors 81 and 82.

As stated above, the diode-coupled transistors 81 and 82 and the cross-coupled transistors 51 and 52 share the same circuit environment so that the diode-coupled transistors track the environmental variations (e.g., variations in fabrication process, operational temperature and operational supply voltage) that affect performance of the cross-coupled transistors. In doing so, the diode-coupled transistors substantially stabilize the comparator's input-to-output gain G during the acquire phase wherein the gain G is defined as the ratio of the output signal $S_{out}$ across the cross-coupled transistors to the input signal $S_{in}$ ($S_{out}$ and $S_{in}$ are shown in FIG. 2).

Figure 4A:
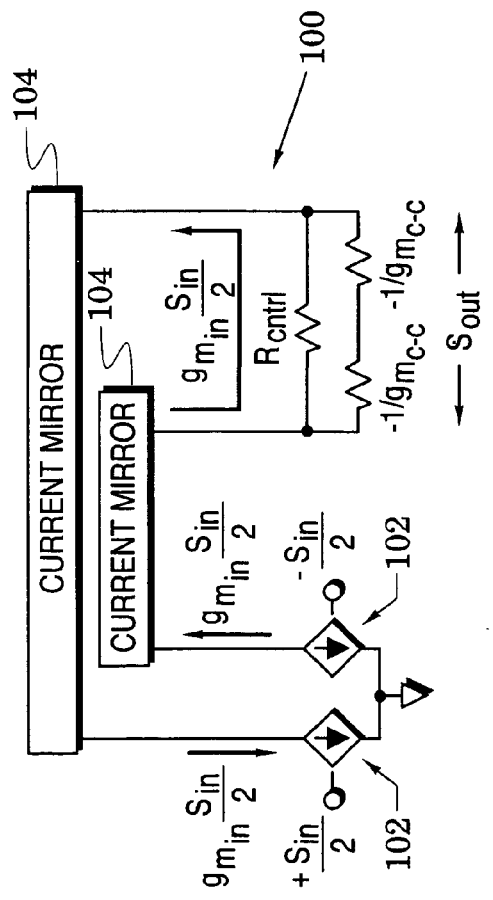
FIGS. 4A and 4B are simplified functional models of comparator structures in FIGS. 2 and 3.
Figure 4B:
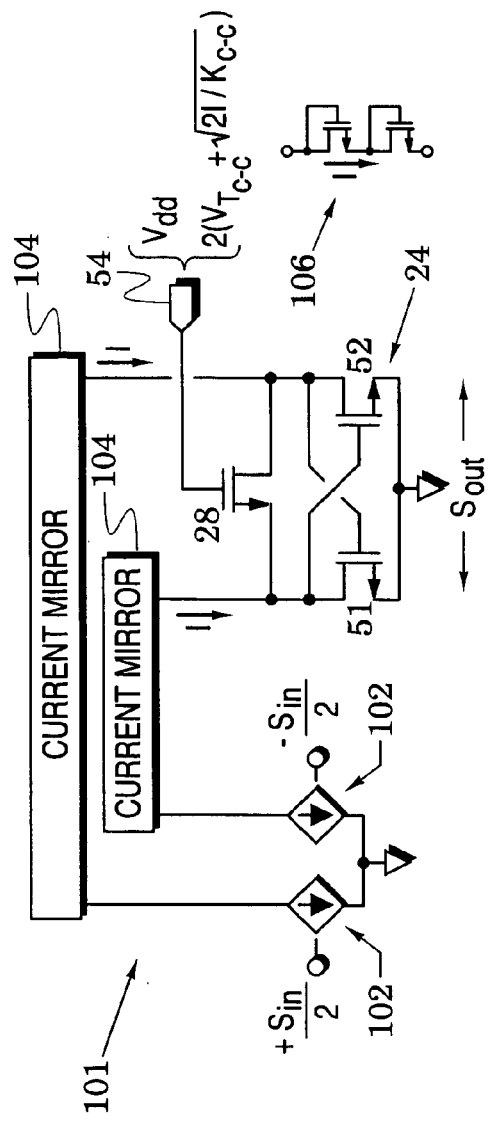

The comparator gain G can be further examined with the aid of FIGS. 4A and 4B which are simplified functional models 100 and 101 of the comparator embodiments shown in FIG. 2 when the comparator system is in its acquire phase of operation. In these models, it is assumed that the differential network of transistors 22 of FIG. 1 is a differential pair of input transistors 102 rather than the differential difference amplifier 42 of FIG. 2. The input transistors 102 are modeled as current controlled sources that each have a transconductance of $g_{m_{in}}$ wherein the subscript "in" refers to the input transistors. Accordingly, a current of $g_{m_{in}}(S_{in}/2)$ is circulated through an output impedance via current mirrors 104.

As shown in FIG. 4A, the output impedance is the parallel combination of two elements wherein the first element is the resistance $R_{cntrl}$ of the control transistor (28 in FIG. 2) when it is biased into strong inversion. The second element is the series combination of two impedances each having the value of $-1/g_{m_{c-c}}$ wherein the subscript "c-c" refers to the cross-coupled transistors 24. It is known that $1/g_m$ is the impedance of a diode-coupled transistor and the minus sign reflects the fact that the cross coupling of the transistors (51 and 52 in FIG. 2) will cause the drain current of either of these transistors to decrease when its drain voltage is increased.

When the parallel impedance of these first and second elements is calculated and multiplied by the circulating current in FIG. 4A, it is found that the comparator gain during the acquire phase is $$G = g_{m_{in}}\left(\frac{-2R_{cntrl}}{g_{m_{c-c}}R_{cntrl} - 2}\right) \quad (1)$$

wherein the subscript "cntrl" refers to the control transistor 28.

Two bias voltages are indicated at the bias port 54 in FIG. 4B. The first is the supply voltage $V_{dd}$ while the second is a bias in a comparator system embodiment of the present invention. The second bias voltage is that across serially-connected diode-coupled transistors 106 and is generated, for example, by the diode-coupled transistors 81 and 82 of FIG. 3. If $V_{dd}$ is applied to the bias port 54 (in accordance with conventional practice), it is apparent from FIG. 4B (and the known relationships of a saturated transistor) that the gate-to-source voltage of the control transistor 28 is given by $$v_{GS_{cntrl}} = V_{dd} - v_{GS_{c-c}} \quad (2)$$
$$= V_{dd} - \left(V_{T_{c-c}} + \sqrt{2I/K_{c-c}}\right)$$

wherein the variable $K=\mu C_{ox}(W/L)$ in which $\mu$ is channel mobility, $C_{ox}$ is oxide capacitance, and W and L are gate width and length. As indicated in FIG. 4B, a current I is mirrored to each of the cross-coupled transistors when there is no imbalance in the system.

If, however, the bias $V_{dd}$ is replaced by the second bias voltage shown at the bias port 54, equation (2) becomes $$v_{GS_{cntrl}} = V_{T_{c-c}} + \sqrt{2I/K_{c-c}} \quad (3)$$

which indicates that $v_{GS}$ of the control transistor 28 (and, thus, the control transistor's behavior) can be stabilized. This follows because:
a) the threshold voltage $V_T$ is set by the fabrication process as is also channel mobility $\mu$ and oxide capacitance $C_{ox}$ of the variable K,
b) gate width W and length L of the variable K are selectively controlled, and
c) the bias current I can be set equal to the current through the cross-coupled transistors 51 and 52.

This gain stabilization can be further demonstrated by observing that $R_{cntrl}$ can be expressed as $$R_{cntrl} = \frac{1}{K_{cntrl}(v_{GS} - V_{T_{cntrl}})} \quad (4)$$

and that the transconductances of the input transistors 102 and the cross-coupled transistors 51 and 52 can be expressed as $$g_{m_{in}} = \sqrt{2K_{in}I} \quad g_{m_{c-c}} = \sqrt{2K_{c-c}I}. \quad (5)$$

Equation (3) can be substituted into equation (4) to obtain $$R_{cntrl} = \frac{1}{K_{cntrl}}\sqrt{\frac{K_{c-c}}{2I}} \quad (6)$$

and equations (5) and (6) can be substituted into equation (1) to obtain $$G = \frac{-2\sqrt{K_{in}K_{c-c}}}{K_{cntrl}}\left(\frac{1}{(K_{c-c}/K_{cntrl}) - 2}\right). \quad (7)$$

As previously stated, the variable $K=\mu C_{ox}(W/L)$. If $\mu$ and $C_{ox}$ are controlled to be the same for all transistors, then equation (7) becomes $$G = \frac{-2\sqrt{\left(\frac{W_{in}}{L_{in}}\right)\left(\frac{W_{c-c}}{L_{c-c}}\right)}}{\left(\frac{W_{cntrl}}{L_{cntrl}}\right)}\left(\frac{1}{\left(\left(\frac{W_{c-c}}{L_{c-c}}\right)/\left(\frac{W_{cntrl}}{L_{cntrl}}\right)\right) - 2}\right) \quad (8)$$

so that gains G of comparator systems of the present invention depend only on device geometries which are well controlled during fabrication processes and independent of operational temperature and supply voltage. Accordingly, the comparator system's gain G during the system's acquisition phases is substantially independent of fabrication process, operational temperature and operational supply voltage. In different comparator embodiments that are structured to enhance particular parameters (e.g., speed), it may be desirable to set all gate lengths L to the minimum permitted by the fabrication technology. In these embodiments, the gain reduces to $$G = \frac{-2\sqrt{W_{in}W_{c-c}}}{W_{cntrl}}\left(\frac{1}{(W_{c-c}/W_{cntrl}) - 2}\right). \quad (9)$$

Inspection of equation (9) discloses that the gate width of the control transistor (28 in FIG. 4B) must be greater than one half of the gate width of the cross-coupled transistors (51 and 52 in FIG. 4B) to ensure a positive gain during the acquire phase. On the other hand, it is desirable to reduce the gate width of the control transistor to reduce its capacitance and thereby enhance the speed of the comparator system. In different embodiments of the comparator system, this is achieved by reducing the size of the diode-coupled bias transistors (81 and 82 in FIG. 3 and 106 in FIG. 4B) which will permit reduction of the size of the control transistor 28 while still maintaining a positive comparator gain.

The structure of the bias network 80 of FIG. 3 is especially suited to systems in which the supply voltage is severely restricted and, as a result, the circuit headroom is severely limited (e.g., a 0.35 micron fabrication technology limits headroom to something on the order of 3.6 volts). Other embodiments of the comparator system may be used when greater headrooms are available. In these embodiments, the diode-coupled transistors 81 and 82 of FIG. 3 can simply be stacked (similar to the transistors 106 in FIG. 4B) and their total voltage transferred via the switch transistors 87 and 89 during the system's acquire and latch phases (i.e., switch transistors 84 and 85 can be eliminated).

Although the diode-coupled transistors shown above (e.g., transistors 81 and 82 of FIG. 3) are a simple, effective arrangement for generating an acquire bias voltage for the control transistor (28 in FIG. 2) during comparators' acquire phase, other useful embodiments may employ the voltage across two transistors that are simply biased into conduction. That is, transistors that are biased at least into weak inversion in which $v_{GS}$ is less than the threshold voltage $V_T$. To enhance comparator performance parameters (e.g., speed), however, it may be advantageous to further bias the transistors into strong inversion in which $v_{GS}$ exceeds the threshold voltage $V_T$. A convenient arrangement for realizing strong inversion is the diode-coupled arrangement of transistors 81 and 82 in FIG. 3 which are biased with sufficient current to ensure that $v_{GS}$ exceeds the threshold voltage $V_T$.

It is noted that the source of the control transistor 28 of FIG. 2 cannot be coupled to ground and, hence, its threshold voltage $V_T$ may vary with the voltage between the source and the transistor's backgate. This may alter the resistance of the control transistor and reduce the system's gain stabilization. In embodiments of the comparator system, this degradation may be eliminated by effectively coupling the control transistor's backgate to its source during the system's acquire phase.

For example, FIG. 3 includes a diode-coupled transistor 110 that receives current through a mirror transistor 97 and a cascode transistor 98 and is coupled to a terminal 111 which is connected to the backgate of the control transistor 28 of FIG. 2. A switch transistor 112 is coupled to pull the voltage at the terminal 111 to ground during the system's latch phase. During the system's acquire phase, the switch transistor 112 is off and the voltage across the diode-coupled transistor 110 is applied to the backgate to thereby mimic the voltage across the cross-coupled transistors 24 which appears at the source of the control transistor 28.

Figure 5:
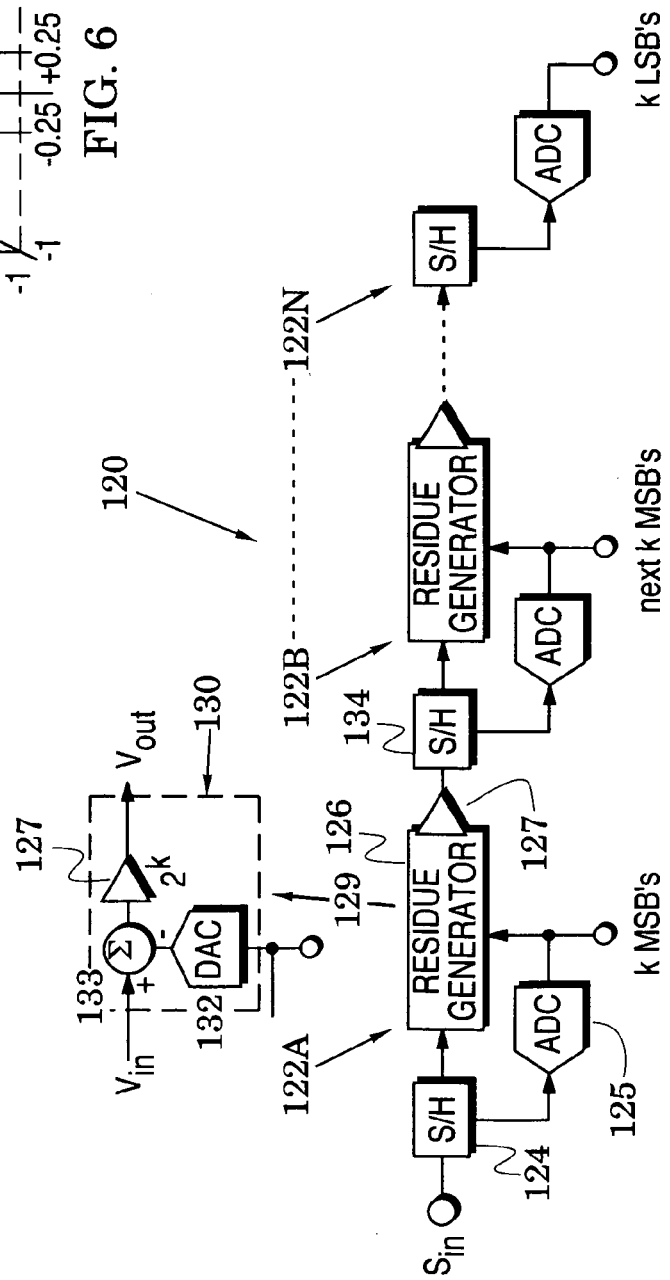
FIG. 5 is a diagram of a pipelined signal converter.

Comparator embodiments of the present invention can be advantageously used in a variety of signal converters. FIG. 5, for example, illustrates an analog-to-digital converter 120 that comprises a plurality of pipelined converter stages 122A, 122B, - - - - 122N. In such systems, each converter stage samples an analog signal, provides at least one corresponding digital bit, and passes to a subsequent stage a residue that represents the difference between each sample and an analog signal that corresponds to the provided digital bit (i.e., an estimate of the sample).

As shown in FIG. 5, a typical stage 122A includes a sampler 124 (designated S/H for sample and hold), an ADC 125, a residue generator 126 and an amplifier 127. In operation of the converter stage 122A, the sampler 124 provides samples of an analog input signal $S_{in}$ at a clocked rate. The ADC 125 converts each sample to k of the most significant bits (MSB's). The residue generator 126 converts the k MSB's to an analog estimate (estimate of the analog sample) and subtracts this analog estimate from the input signal $S_{in}$ to form a residue signal that can be passed to a subsequent converter stage for derivation of further MSB's.

To enhance conversion accuracy, the residue signal is preferably amplified in the amplifier 127 so that the analog window presented to the subsequent stage is substantially that of the present stage. Because the final converter stage 122N provides the final least significant bits (LSB's), it does not require the residue generator of preceding stages.

Example arrow 129 indicates that an exemplary residue generator is a multiplying digital-to-analog converter (MDAC) 130 that includes a DAC 132, a summer 133, and the amplifier 127 (with gain $2^k$). The DAC 132 responds to the ADC 125 by forming the analog estimate, the summer 133 forms the residue by subtracting the analog estimate from the analog sample, and the amplifier amplifies the residue with gain $2^k$. Finally, a sampler 134 samples the output of the MDAC 130 to thereby provide analog samples to the subsequent converter stage at the converter's clock rate.

MDAC's have been configured with various structures such as switched-capacitor structures that present at least one capacitor to receive a charge from a preceding stage in one phase of the MDAC's operation. In a second phase of this operation, the capacitor is switched to transfer its charge into another capacitor that is coupled about a high-gain amplifier. The received and transferred charge forms the amplified residue signal.

Figure 6:
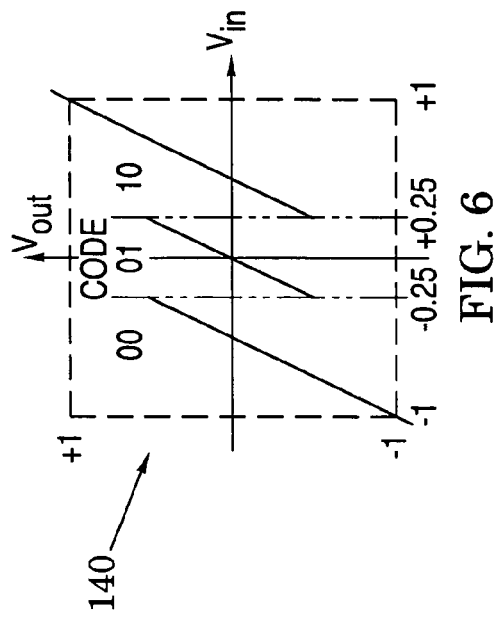
FIG. 6 is a diagram that shows a transfer function of a multiplying digital-to-analog converter in the signal converter of FIG. 5.

An exemplary ADC for the converter stage 122A of FIG. 5 is a 1.5 bit ADC and the transfer function of an MDAC for this ADC is shown in the graph 140 of FIG. 6 in which it is assumed that the ADC has a full scale range of 2 volts. The graph 140 thus indicates the input voltage $V_{in}$ and output voltage $V_{out}$ of the MDAC.

The graph also shows the corresponding digital codes provided by the 1.5 bit ADC which includes two comparators that respectively compare the input signal to −0.25 volts and to +0.25 volts to thereby produce the codes 00, 01 and 10 shown in the graph. As further indicated in the graph, the MDAC includes gain sufficient to produce a full scale output range (2 volts) that corresponds to input signals which span the entire input range (2 volts). The 1.5 bit ADC stage reduces errors that would otherwise occur because of converter offsets.

Figure 7:
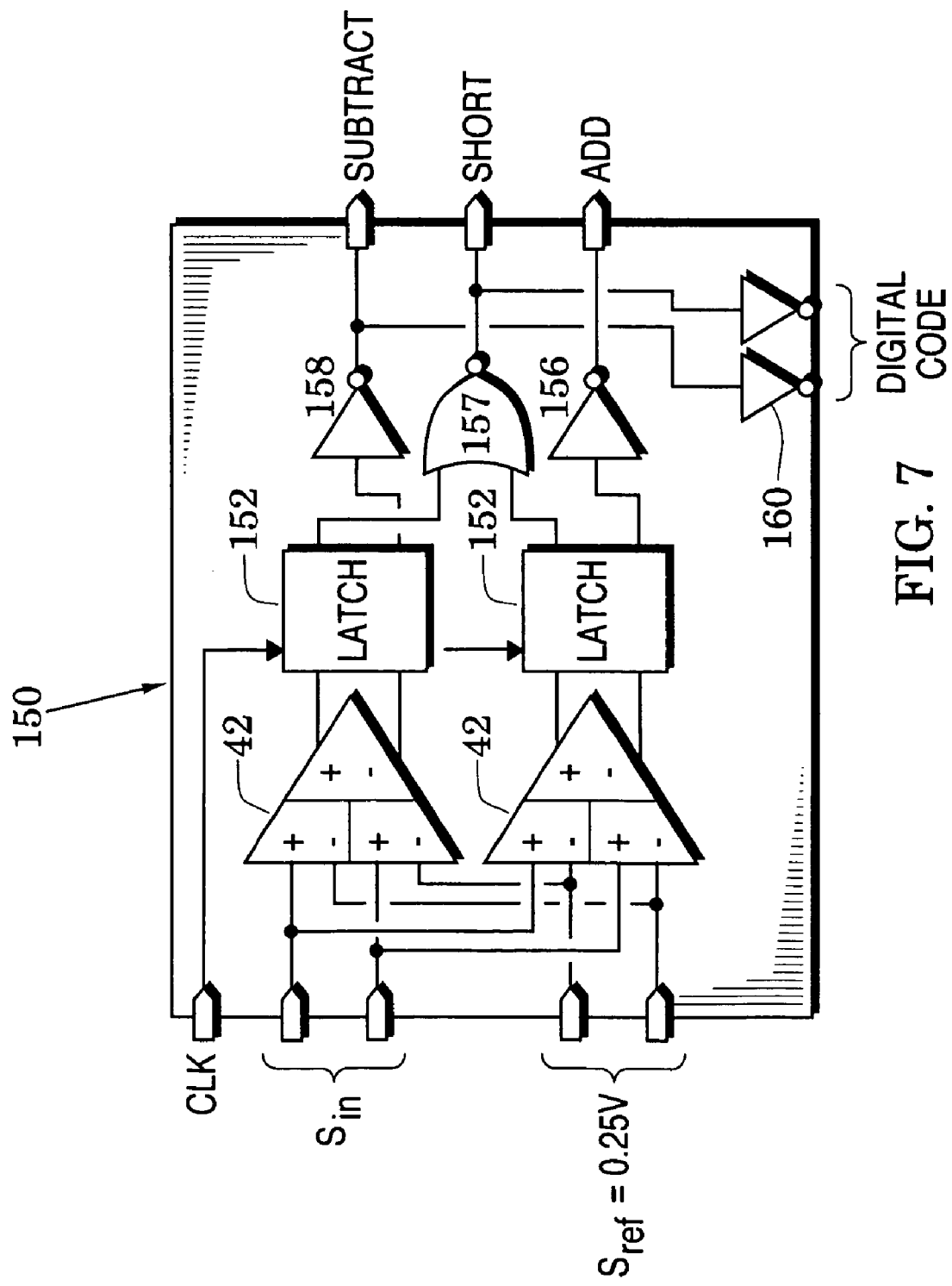
FIG. 7 is a diagram that illustrates comparator system embodiments of the present invention applied to the signal converter of FIG. 5.

FIG. 7 illustrates a comparator system 150 that corresponds to the MDAC transfer function 140 of FIG. 6 and can thus serve as the ADC 125 in FIG. 5. The system 150 includes two of the differential difference amplifiers 42 that were introduced in FIG. 2. They are shown by amplifier symbols which each receive the input signal $S_{in}$ and a reference signal $S_{ref}$ that is set to 0.25 volts to correspond to the graph 140 of FIG. 6. It is noted that the reference signal is reversed at the inputs to one of the differential difference amplifiers to thus establish the −0.25 and +0.25 reference levels shown in FIG. 6.

The differential difference amplifiers 42 drive latches 152 which, in one embodiment, are formed of the remaining elements of FIGS. 2 and 3. The latches 152 respond to the clock signal and drive inverters 156 and 158 and a nor gate 157. Inverters 160 respond to the nor gate 157 and inverter 158 and, thereby, provide the digital code which corresponds to the k MSB's shown to be provided by the ADC 125 of FIG. 5.

The nor gate 157 provides a short signal which will cause the summer 133 and amplifier 127 of FIG. 5 to generate the transfer function shown in FIG. 6 between −0.25 and +0.25 of $V_{in}$. The inverters 156 and 158 provide add and subtract signals which will respectively cause the summer 133 and amplifier 127 to offset the transfer function up and down as shown in FIG. 6.

Comparator system embodiments of the invention have been shown to include differential network of transistors (e.g., 22 in FIG. 1). Various embodiments of these networks may be used in the comparator systems including the differential difference amplifiers 42 shown in FIGS. 2 and 7 and the differential pair of transistors 102 shown in FIGS. 4A and 4B.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A comparator system that provides a latch signal in response to an input signal, comprising:
    a differential network of transistors for receiving said input signal;
    cross-coupled transistors that respond to said differential network;
    a control transistor connected across said cross-coupled transistors and having a control terminal; and
    a bias network configured to apply to said control terminal:
        a) in a system latch phase, a latch bias voltage that biases off said control transistor; and
        b) in a system acquire phase, an acquire bias voltage that is substantially the voltage across two transistors which are each biased into conduction;
    wherein said bias network includes:
    a capacitor having first and second plates;
    first and second transistors that provide first and second voltages and are each biased into conduction; and
    a switch network that, in a system latch phase, couples said first plate to receive said first voltage and, in a system acquire phase, couples said second plate to receive said second voltage and couples said first plate to said control terminal;
    said cross-coupled transistors thereby providing said latch signal in said latch phase.

2. The system of claim 1, wherein said first and second transistors are diode-coupled transistors.

3. The system of claim 1, wherein said second plate is coupled to said second transistor and said switch network includes:
    first and second switch transistors arranged to couple said capacitor across said first transistor in said system latch phase; and
    a third switch transistor that couples said first plate to said control terminal in said acquire phase.

4. A comparator system that provides a latch signal in response to an input signal, comprising:
    a differential network of transistors for receiving said input signal;
    cross-coupled transistors that respond to said differential network;
    a control transistor connected across said cross-coupled transistors and having a control terminal; and
    a bias network configured to apply to said control terminal:
        a) in a system latch phase, a latch bias voltage that biases off said control transistor; and
        b) in a system acquire phase, an acquire bias voltage that is substantially the voltage across two transistors which are each biased into conduction;
    and further including first and second current mirrors that are each coupled between a respective transistor of said differential network and a respective one of said cross-coupled transistors;
    said cross-coupled transistors thereby providing said latch signal in said latch phase.

5. The system of claim 4, further including first and second common-gate transistors respectively inserted between said first and second current mirrors and said cross-coupled transistors.

6. The system of claim 5, wherein the transistors of said differential network, said cross-coupled transistors, said control transistor and said first and second common-gate transistors are metal-oxide-semiconductor transistors.

7. The system of claim 4, wherein said control transistor has a backgate terminal and said bias network is further configured to apply to said backgate terminal:
    a) in a system latch phase, a latch bias voltage that biases off said control transistor; and
    b) in a system acquire phase, an acquire bias voltage that substantially equals the voltage across a transistor biased into saturation.

8. The system of claim 4, wherein said differential network is a differential pair of transistors arranged to receive said input signal.

9. A comparator system that provides a latch signal in response to an input signal, comprising:
    a differential network of transistors for receiving said input signal;
    cross-coupled transistors that respond to said differential network;
    a control transistor connected across said cross-coupled transistors and having a control terminal; and
    a bias network configured to apply to said control terminal:
        a) in a system latch phase, a latch bias voltage that biases off said control transistor; and
        b) in a system acquire phase, an acquire bias voltage that is substantially the voltage across two transistors which are each biased into conduction;
    wherein said differential network is a differential difference amplifier having first and second input ports for respectively receiving said input signal and a reference signal;
    and wherein said differential difference amplifier comprises first and second differential pairs of transistors wherein each transistor of said first pair has an output terminal coupled to an output terminal of a respective transistor of said second pair;
    said cross-coupled transistors thereby providing said latch signal in said latch phase.

10. The system of claim 9, wherein said bias network includes:
    a capacitor having first and second plates;
    first and second transistors that provide first and second voltages and are each biased into conduction; and
    a switch network that, in a system latch phase, couples said first plate to receive said first voltage and, in a system acquire phase, couples said second plate to receive said second voltage and couples said first plate to said control terminal.

11. The system of claim 9, wherein said bias network includes:

serially-connected first and second transistors that are each biased into conduction; and a switch network that couples said first and second diode-coupled transistors to said control terminal in said system acquire phase.

12. The system of claim 11, wherein said first and second transistors are each diode-coupled transistors.

13. The system of claim 9, further including first and second current mirrors that are each coupled between a respective transistor of said differential network and a respective one of said cross-coupled transistors.

14. A converter system, comprising:
 a plurality of converter stages serially connected to thereby convert an analog input signal to a corresponding digital output signal wherein at least one of said stages includes:
 a comparator system that converts a respective portion of said input signal to at least one latch signal and at least one corresponding digital bit of said output signal; and
 a residue generator that provides another portion of said input signal to a subsequent one of said converter stages in the form of a residue signal which said generator generates in response to said respective portion and said corresponding digital bit;
and wherein said comparator system includes:
 a differential difference amplifier for receiving said respective portion and a reference signal;
 cross-coupled transistors that respond to said differential difference amplifier;
 a control transistor connected across said cross-coupled transistors and having a control terminal; and
 a bias network configured to apply to said control terminal:
  a) in a system latch phase, a latch bias voltage that biases off said control transistor; and
  b) in a system acquire phase, an acquire bias voltage that is substantially the same as the voltage across two transistors which are each biased into conduction;
 said cross-coupled transistors thereby providing said latch signal in said latch phase;

wherein said bias network includes:
 a capacitor having first and second plates;
 first and second transistors that provide first and second voltages and are each biased into conduction; and
 a switch network that, in a system latch phase, couples said first plate to receive said first voltage and, in a system acquire phase, couples said second plate to receive said second voltage and couples said first plate to said control terminal.

15. The system of claim 14, wherein said comparator system further includes at least one gate that provides said corresponding digital bit in response to said latch signal.

16. The system of claim 15, wherein said differential difference amplifier comprises first and second differential pairs of transistors wherein each transistor of said first pair has an output terminal coupled to an output terminal of a respective transistor of said second pair.

17. The system of claim 16, further including first and second current mirrors that are each coupled between a respective transistor of said differential difference amplifier and a respective one of said cross-coupled transistors.

18. The system of claim 14, wherein said first and second transistors are diode-coupled transistors.

19. The system of claim 14, wherein said second plate is coupled to said second transistor and said switch network includes:
 first and second switch transistors arranged to couple said capacitor across said first transistor in said system latch phase; and
 a third switch transistor that couples said first plate to said control terminal in said acquire phase.

20. The system of claim 14, wherein said control transistor has a backgate terminal and said bias network is further configured to apply to said backgate terminal:
 a) in a system latch phase, a latch bias voltage that biases off said control transistor; and
 b) in a system acquire phase, an acquire bias voltage that substantially equals the voltage across a transistor biased into saturation.

* * * * *